(12) United States Patent
Andersen et al.

(10) Patent No.: US 6,249,470 B1
(45) Date of Patent: Jun. 19, 2001

(54) BI-DIRECTIONAL DIFFERENTIAL LOW POWER SENSE AMP AND MEMORY SYSTEM

(75) Inventors: John E. Andersen, Essex Junction; Michael R. Ouellette, Westford, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/454,265

(22) Filed: Dec. 3, 1999

(51) Int. Cl.⁷ .................................................. G11C 7/02
(52) U.S. Cl. ...................................... 365/207; 365/230.06
(58) Field of Search .................................. 365/207, 202, 365/203, 220, 230.06, 230.03, 196; 327/51, 52, 53, 54, 55, 56, 57

(56) References Cited

U.S. PATENT DOCUMENTS

| | | | |
|---|---|---|---|
| 4,716,552 | 12/1987 | Maltiel et al. | 365/222 |
| 4,719,601 | 1/1988 | Gray et al. | 365/210 |
| 4,833,646 | 5/1989 | Turner | 365/185 |
| 5,150,328 | 9/1992 | Aichelmann, Jr. | 365/189.03 |
| 5,166,903 | 11/1992 | Aichelmann, Jr. | 365/189.03 |
| 5,192,878 * | 3/1993 | Miyamoto et al. | 307/362 |
| 5,345,121 * | 9/1994 | Itoh | 307/530 |
| 5,349,302 | 9/1994 | Cooper | 365/207 |
| 5,367,488 | 11/1994 | An | 365/189.01 |
| 5,426,610 | 6/1995 | Childers et al. | 365/205 |
| 5,479,374 * | 12/1995 | Kobayashi et al. | 365/233.5 |
| 5,498,984 | 3/1996 | Schaffer | 327/51 |
| 5,499,218 | 3/1996 | Ahn et al. | 365/230.06 |
| 5,504,443 * | 4/1996 | Gross et al. | 327/51 |
| 5,539,691 * | 7/1996 | Kozaru et al. | 365/189.05 |
| 5,570,319 * | 10/1996 | Santoro et al. | 365/230.03 |
| 5,644,543 | 7/1997 | Kim et al. | 365/207 |
| 5,675,542 | 10/1997 | Ford | 365/189.11 |
| 5,774,407 | 6/1998 | Kim | 365/230.03 |
| 5,777,938 * | 7/1998 | Nakamura et al. | 365/220 |
| 5,903,171 * | 5/1999 | Shieh | 327/55 |
| 5,939,903 * | 8/1999 | Lin | 327/57 |
| 5,959,913 * | 9/1999 | Raad | 365/201 |
| 5,959,919 * | 9/1999 | Choi | 365/207 |
| 5,978,286 * | 11/1999 | Chang et al. | 365/196 |
| 6,005,816 * | 12/1999 | Manning et al. | 365/208 |

OTHER PUBLICATIONS

Bharadwaij S. Amrutur and Mark Horowitz, "Techniques to Reduce Power in Fast Wide Memories", Center for Integrated Systems. Date unavailable.

* cited by examiner

*Primary Examiner*—Richard Elms
*Assistant Examiner*—Anh Phung
(74) *Attorney, Agent, or Firm*—Schmeiser, Olsen & Watts; Robert A. Walsh

(57) ABSTRACT

According to the preferred embodiment, a device and method is provided for reducing power consumption in memory devices. The preferred embodiment reduces power consumption by providing a sense amplifier that reduces power consumption while providing high performance. In the preferred embodiment, the sense amplifier comprises a bi-directional sense amp that is configurable for use on low power static random access memory (SRAM) devices. The bi-directional sense amp allows the same sense amp to be used for both read and write operations on the memory cells. The preferred embodiment sense amp facilitates the use of differential data buses, further reducing power consumption while providing high performance. Thus, the preferred embodiment bi-directional differential sense amp reduces the device size and complexity, reducing power consumption while providing high performance memory access.

14 Claims, 7 Drawing Sheets

BI-DIRECTIONAL DIFFERENTIAL LOW POWER SENSE AMP AND MEMORY SYSTEM

BACKGROUND OF THE INVENTION

1. Technical Field

This invention generally relates to semiconductor devices, and more specifically relates to semiconductor memory devices.

2. Background Art

The proliferation of electronics in our modern world is in large part due to integrated circuit semiconductor devices. Integrated semiconductor devices are designed and used in almost every electronic device today. In many applications power consumption is a critical issue for several reasons. For example, in portable devices such as wireless telephones, battery life and battery size are primary design concerns. Consumers want the portable electronic device to run as long as possible using a single battery charge and also want the device, including, the battery to be as small and portable as possible. Thus, it is strongly desirable to be able to decrease power consumption of the device such that battery life can be extended and/or the size of the battery decreased.

In other applications power consumption is critical because it is directly related to the amount of heat generated by a device. A semiconductor device that consumes more power will generate more heat. In applications where heat sensitivity is a critical factor, reducing the power consumption reduces the heat generated by the device.

In many applications the power consumption of the device memory is a significant issue. For example, devices such as phones, pagers and palmtop computers all use various amounts of memory in which memory power consumption is a significant factor. In these systems it is desirable to use memory architectures and supporting circuitry that minimize power consumption. Unfortunately, many of the low power memory systems used today suffer from significant drawbacks, such as relatively large size or insufficient performance. Therefore, what is needed is a memory system that minimizes power consumption, minimizes device size while providing acceptable memory performance.

DISCLOSURE OF INVENTION

According to the present invention, a device and method is provided that reduces power consumption in memory devices. The present invention provides a sense amplifier that reduces power consumption while providing high performance. In the preferred embodiment of the present invention, the sense amplifier comprises a bi-directional differential sense amp that is configurable for use on low power devices. The bi-directional sense amp allows the same sense amp to be used for both read and write operations on the memory cells. The preferred embodiment sense amp facilitates the use of differential data buses, further reducing power consumption while providing high performance. Thus, the preferred embodiment bi-directional differential sense amp reduces the device size and complexity, reducing power consumption while providing high performance memory access.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

According to the present invention, a device and method is provided for reducing power consumption in memory devices. The present invention reduces power consumption by providing a sense amplifier that reduces power consumption while providing high performance. In the preferred embodiment of the present invention, the sense amplifier comprises a bi-directional sense amp that is configurable for use on low power static random access memory (SRAM) devices. The bi-directional sense amp allows the same sense amp to be used for both read and write operations on the memory cells. The preferred embodiment sense amp facilitates the use of differential data buses, further reducing power consumption while providing high performance. Thus, the preferred embodiment bi-directional differential sense amp reduces the device size and complexity, reducing power consumption while providing high performance memory access.

Figure 1:
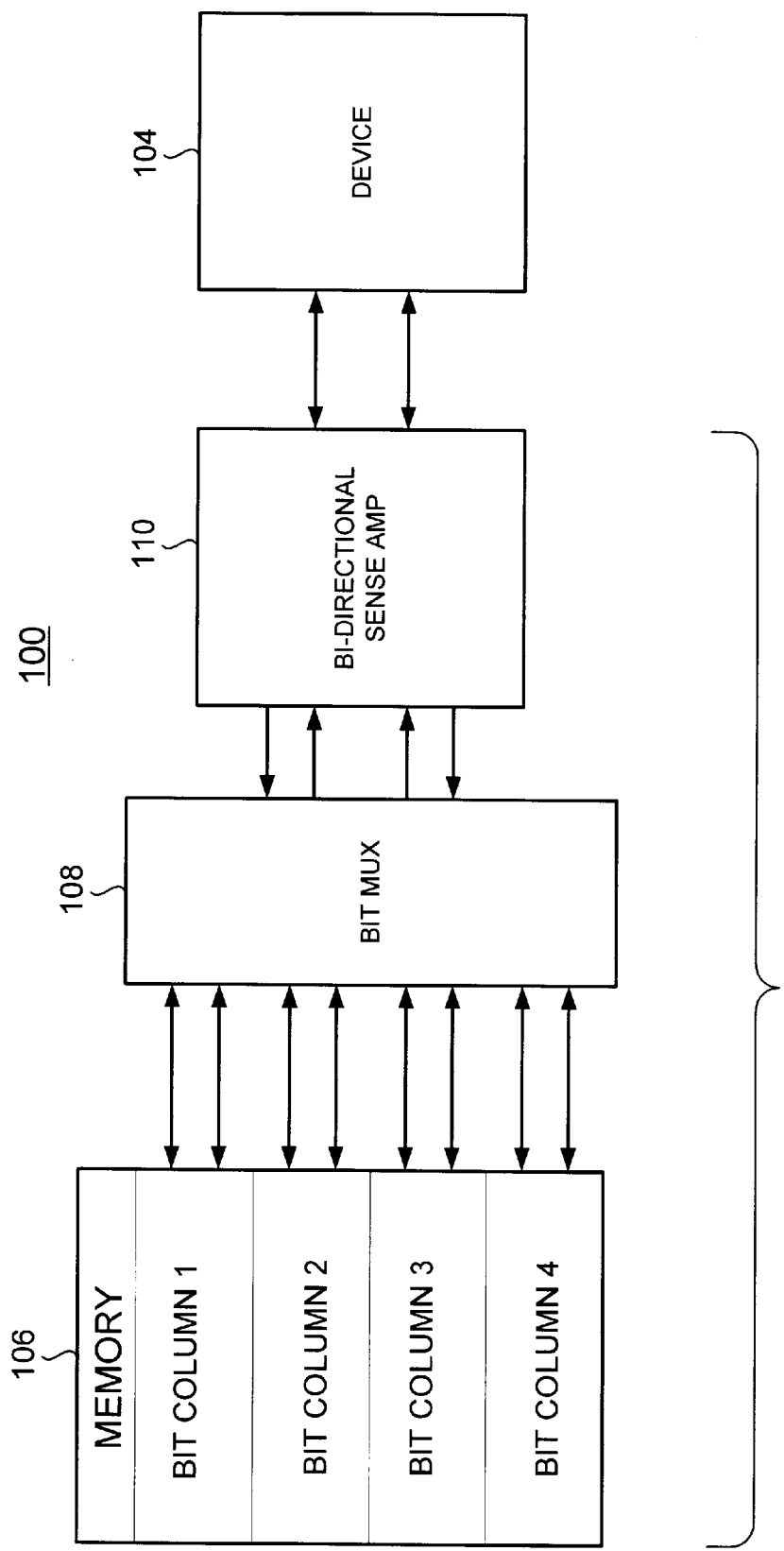
FIG. 1 is a schematic diagram of a generic system 100.

Turning now to FIG. 1, a generic system 100 is shown to illustrate the general workings of a memory system 102 in relation to a generic device 104. The generic device 104 could be any type of device that requires memory, such as microprocessors, digital signal processors, application specific integrated circuits, etc. Furthermore, as will be described in greater detail later, the preferred embodiment of the present invention is particularly applicable to ASICs that are used in applications where low power consumption and small device size is highly desirable. Examples of applications include most mobile communication devices such as wireless phones, radios and pagers, other electronic devices such as data organizers, and portable computers, and many other consumer items. The memory system 102 thus provides the memory needed for the generic device 104 and includes memory 106, bit mux 108 and a bi-directional sense amp 110.

The memory 106 is preferably an array of static random access memory (SRAM) cells. SRAM is preferred due to high performance and low power usage characteristics. Of course, the preferred embodiment could be adapted for use in other types of memory systems, such as dynamic random access memory (DRAM) and its many variations (SDRAM, etc.)

In the illustrated example, the memory includes four bit columns and the bit mux 108 provides for the switching between the bit columns in memory 106. In particular, the bit mux 108 controls which bit column is read from or written to by the bi-directional sense amp. Again, the desired number of bit columns and corresponding number of inputs on bit mux 108 would depend on the specific application. However, it is generally desirable to limit the number of bit columns do to excessive power consumption that can result from two many bit columns cycling with each read or write by a sense amp. The preferred design for the bit muxes 108 will be discussed in more detail with regard to FIG. 2.

In the preferred embodiment, data to and from the memory uses differential data lines to access each bit column in the memory. Specifically, a bi-directional differential data bus exists between the bit mux 108 and each bit column in tile memory. In FIG. 1, there are illustrated four such bi-directional differential data buses. Again, this is just one type of configuration that can be used, and the preferred embodiment can be adapted to use more or less differential data buses depending on the specific application requirements and the number of bit columns used.

Bi-directional differential data lines improve the performance of the memory system in several ways. First, single line systems typically use rail-to-rail switching that requires significant power and time to switch. By contrast, the differential lines switch just enough for the sense amp to detect which line is switching. Additionally, the use of bi-directional data lines conserves line area compared to solutions that require separate data lines for read and write between the device and the memory.

During write operations, bi-directional differential sense amp 110 amplifies data signals received from the device 104 and drives those amplified data signals to bit mux 108. Likewise, during read operations sense amp 110 amplifies data signals received from the memory 106 (through bit mux 108) and drives those amplified data signals to the device 104. Thus, the bi-directional differential sense amp 200 provides signal amplification for both read from and writing to the memory 106. Because the preferred embodiment uses the same sense amp for both read and write operations, device complexity is minimized and power consumption minimized. Furthermore, because the sense amp 110 facilitates the use of differential data signals, high performance is provided with minimized power consumption.

It should be noted that for clarity FIG. 1 illustrates the memory system for only a single bit of data, and a typical device would have multiple bits (e.g., 4, 8, 16, 32, 64, 128, etc) that are read together in parallel. A typical memory system would thus include the memory cells, bit muxes and a sense amplifier for each bit in the system. Thus, to give one example, a 64 bit memory system would have 64 sense amps reading and writing to 64 bits of information simultaneously.

Figure 2:
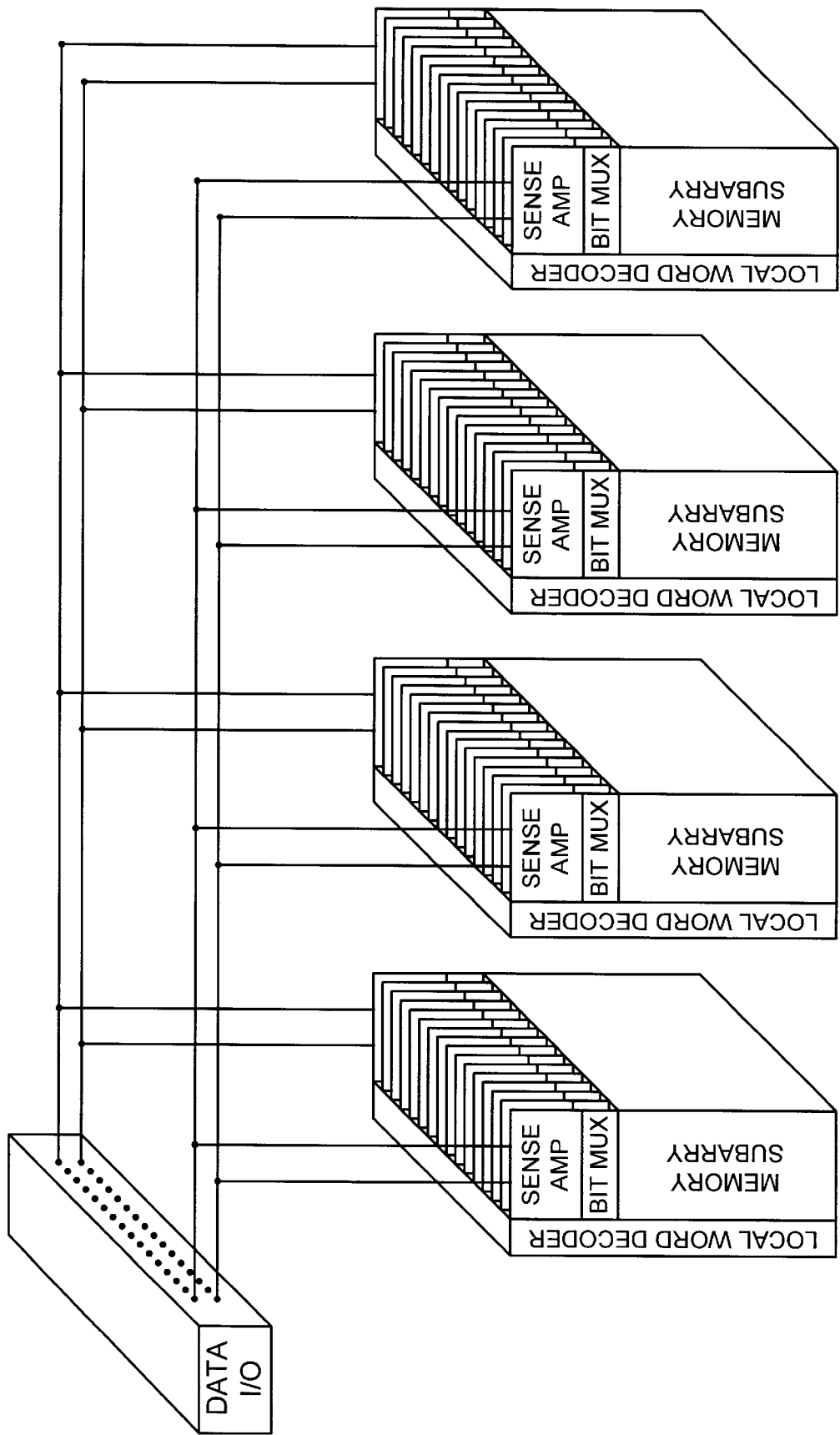
FIG. 2 is a schematic diagram of a memory system 120 in accordance with the preferred embodiment of the present invention.

Additionally, in the preferred embodiment the overall memory system is configured into multiple subarrays of memory. The use of multiple subarrays facilitates selective activation of memory. Turning to FIG. 2, an example memory system 120 is illustrated in which multiple subarrays are used. Specifically, the example illustrated in FIG. 2 shows a memory system 120 that includes four memory subarrays. Each of exemplary the four memory subarrays is 16 bits wide, and thus includes 16 sense amps and 16 bit muxes (with each bit mux selectively addressing multiple bit columns). Of course, this is just one example of the number and width of subarrays which can be used depending on the needs of the specific application. The subarrays are joined at the differential bi-directional data buses. In particular, in this example there would be 16 true/complement data bits comprising the bus, with each bit connected to one sense amp in each subarray. (with FIG. 2 illustrating only two of the 16 true/complement data bit pairs for clarity).

Preferably, data from the individual subarrays is selected using the word line decoders. For example, in a memory system containing four subarrays, the top 2 bits in the memory address are used to select which of the subarrays to activate and read or write to.

Using multiple subarrays has the advantage of additionally reducing power consumption. Power consumption is reduced because only the memory in the selected subarray is activated during a read or write operations. Thus, a system can have a relatively large memory without excessive power consumption. This is preferably accomplished by using global word line decoders that selectively activate only those local word lines that service selected memory subarrays. Because only the local word lines in the selected subarray are activated, the bit lines in the other subarrays do not cycle during a read or write, and thus do not need to be restored to Vdd after the operation. This significantly reduces the power consumption in the non-selected subarrays.

Figure 3:
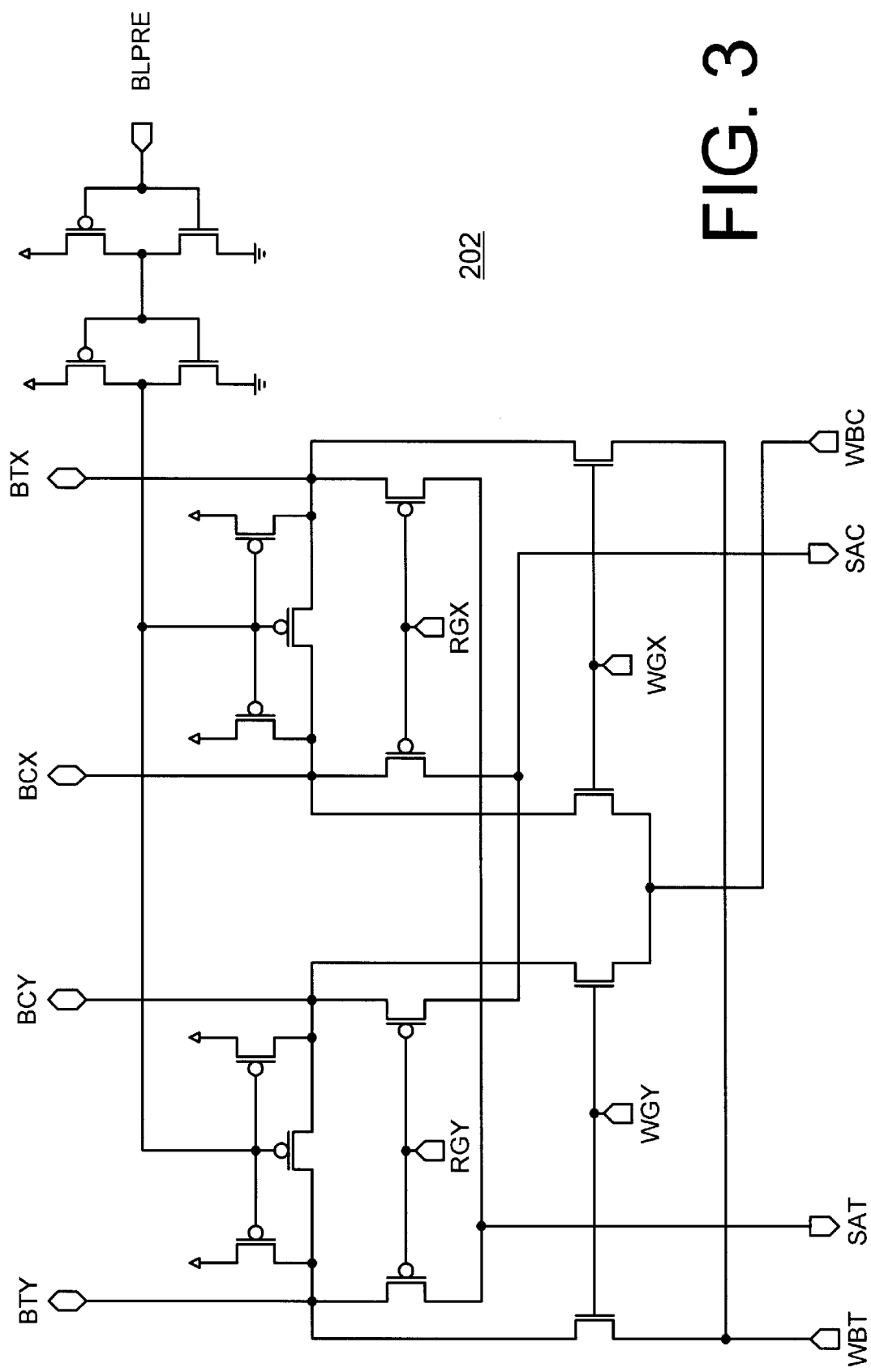
FIG. 3 is a circuit diagram of a bit mux 202 in accordance with the preferred embodiment of the present invention.

Turning now to FIG. 3, a schematic view of an exemplary bit mux 202 is illustrated. Bit mux 202 is an example of one of the many types of bit muxes that could perform the function of bit mux 108 in FIG. 1. Bit mux 202 is a two-to-one bit mux, meaning that it serves to selectively address memory cells from one of two different subarrays. Bit mux 202 accomplishes this by switching between reading and writing from two sets of differential databuses, one for each memory subarray. Likewise, a similar bit mux designed to switch between four subarrays would switch between four different sets of differential databuses.

Bit mux 202 includes four input/outputs that connect to the memory cells, bitline true Y (BTY), bitline complement Y (BCY), bitline true X (BTX) and bitline complement X (BCX). BTY and BCY serve as the differential input/outputs for bit line Y, and BTX and BCX serve as the differential input/outputs for bit line X. Likewise, bit mux 202 includes two write inputs, and two read outputs that connect to the sense amp. Specifically, the write bitline true (WBT) and write bitline complement (WBC) receive signals from the sense amp during writes and pass those signals to a selected input/output pair. Likewise, sense amp true (SAT) and sense amp complement (SAC) are connected to the sense amp. The bit mux receives signals from a selected input/output pair and passes those signals to SAT/SAC during read operations.

Bit mux 202 also includes five control inputs, read gate X (RGX), read gate Y (RGY), write gate X (WGX), write gate Y (WGY) and bit line precharge (BLPRE). This inputs control what input/output pair is coupled to the sense amp, and whether data is passed to the sense amp from the memory cells (read) or passed from to the cells from the sense amp (write). The BLPRE is a bit line precharge signal that activates equalization circuits and causes the bit mux 202 to pull the bit lines BTX, BCX, BTY and BCY high when BLPRE is activated. Generally, it is preferable to keep the bit lines held high and equalized when they are not in use transmitting data signals as this reduces power consumption that would result from unnecessary switching on the bit lines.

When RGY, WGY, and WGX are low, and RGX and BLPRE are high, the SAT/SAC outputs to the sense amp are coupled to the BTY and BCY input/outputs, facilitating a read from the Y bit lines. Likewise, when RGX, WGX and WGY are low, and RGY and BLPRE are high, the SAT/SAC outputs from the sense amp arc coupled to the BTX and BCX input/outputs, facilitating a read from the X bit lines.

When WGY, RGY, RGX and BLPRE are high, and WGX is low, the WBT/WBC inputs from the sense amp are coupled to the BTY and BCY input/outputs, facilitating a write to the Y bit lines. Likewise, when WGX, RGX, RGY and BLPRE are high, and WGY is low, the WBT/WBC inputs from the sense amp are coupled to the BTX and BCX input/outputs, facilitating a write to the X bit lines.

Thus, bit mux 202 can be used to selectively control whether differential signals are passed to or from the sense amp, and to which differential bit lines the differential signals are passed from or to.

Figure 4:
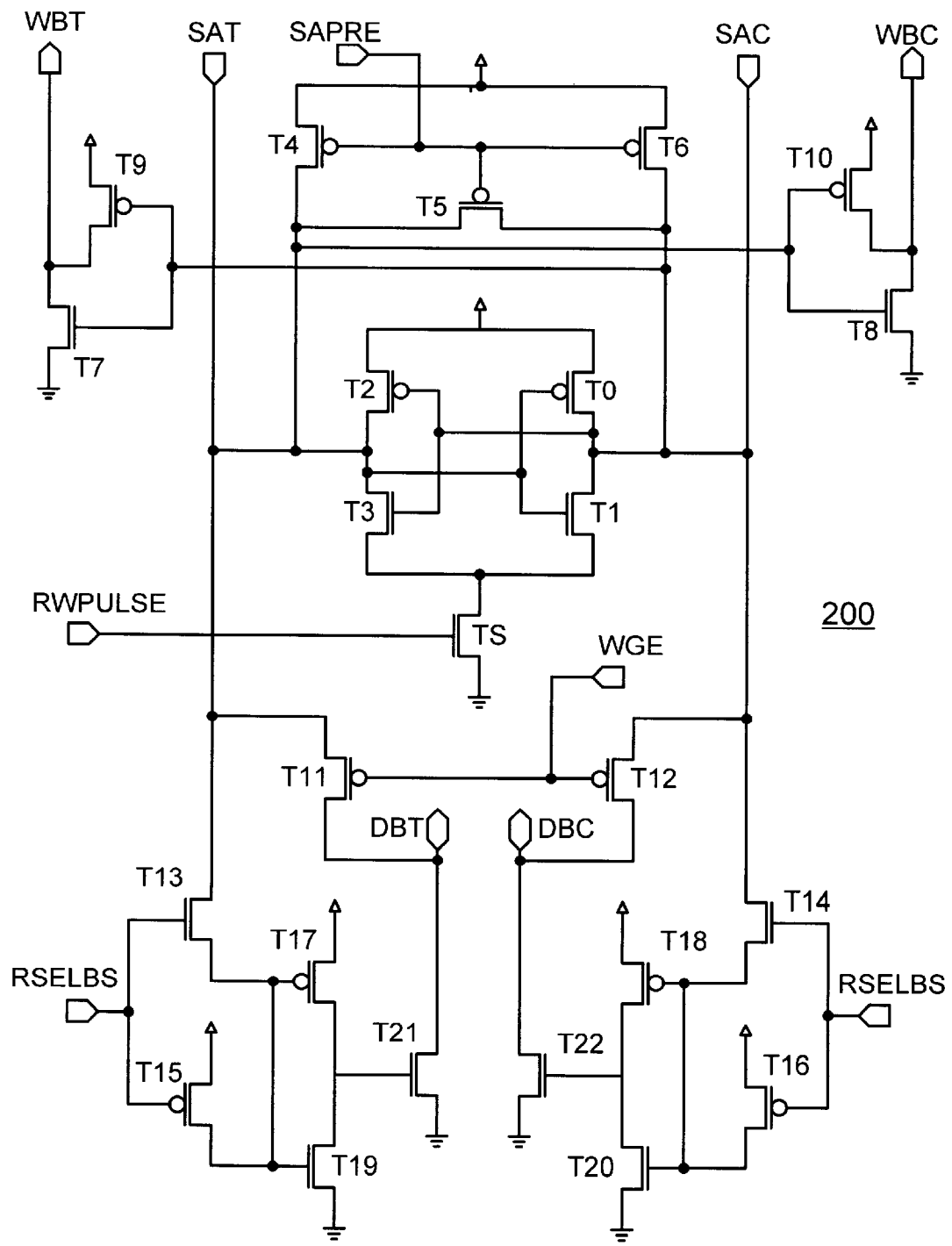
FIG. 4 is circuit diagram of a bi-directional differential sense amp in accordance with the preferred embodiment of the present invention.

Turning now to FIG. 4, the preferred embodiment bi-directional differential sense amp 200 is illustrated schematically. These preferred embodiment bi-directional differential sense amp 200 is an example of the type of sense amps that can be used for sense amp 10 in FIG. 1. Sense amp 200 operates bi-directionally, amplifying signals during both read and write operations. Specifically, during a read sense amp 200 amplifies differential signals received on inputs SAT/SAC from the memory cells, and passes those amplified signals to the connected device though database true (DBT) and databuse complement (DBC) input/outputs. Likewise, during a write sense amp 200 amplifies differential signals received on DBT/DBC from the device and passes those amplified differential signals to the bit muxes and selected memory cells though WBT/WBC.

The sense amp 200 receives four control signals, WGE, SAPRE, RWPULSE and RSELBS that together control the operation of sense amp 200. WGE is a write gate enable signal that is enabled (low) when the sense amp 200 is to read data from the bi-directional databus DBT/DBC. RWPULSE is a pulse signal that enables (high) when data is has been put on the SAT/SAC inputs for amplification. The RWPULSE signal is preferably controlled by block control logic. The RSELBS signal is a signal that takes amplified data from the SAT/SAC inputs and puts it on the DBT/DBC outputs, and is also provided by the block control logic. The SAPRE signal restores and equalizes the SAT/SAC inputs to VDD when enabled (low).

The WGE signal is preferably provided by gating logic that provides the gating control signals at the appropriate time and with the appropriate pulse widths for read and write operations. Likewise, the RWPULSE, RSELBS and SAPRE control signals are provided by block control logic.

In sense amp 200, four transistors T0, T1, T2, and T3 are arranged as a cross-coupled latch and serve to amplify differential signals applied to the SAT/SAC inputs when turned the RWPULSE signal turns on transistor TS. Transistors T4, T5, and T6 serve to restore and equalize SAT/SAC to VDD when turned on by SAPRE.

Transistors T11 and T12 are turned on by the WGE signal during write operations. When turned on during writes, transistors T11 and T12 put signals from DBT/DBC onto SAT/SAC. Transistors T7, T8, T9, and T10 operate as a write driver serve to drive amplified signals out the WBT/WBC outputs during write operations.

Transistors T13 T14, T15, T16, T17, T18, T19, T20, T21 and T22 operate as read driver and serve to drive amplified signals out the DBT/DBC nodes during read operations. When enabled by RSELBS, these transistors take the amplified differential signal on SAT/SAC and present it to the databus DBT/DBC.

Figure 5:
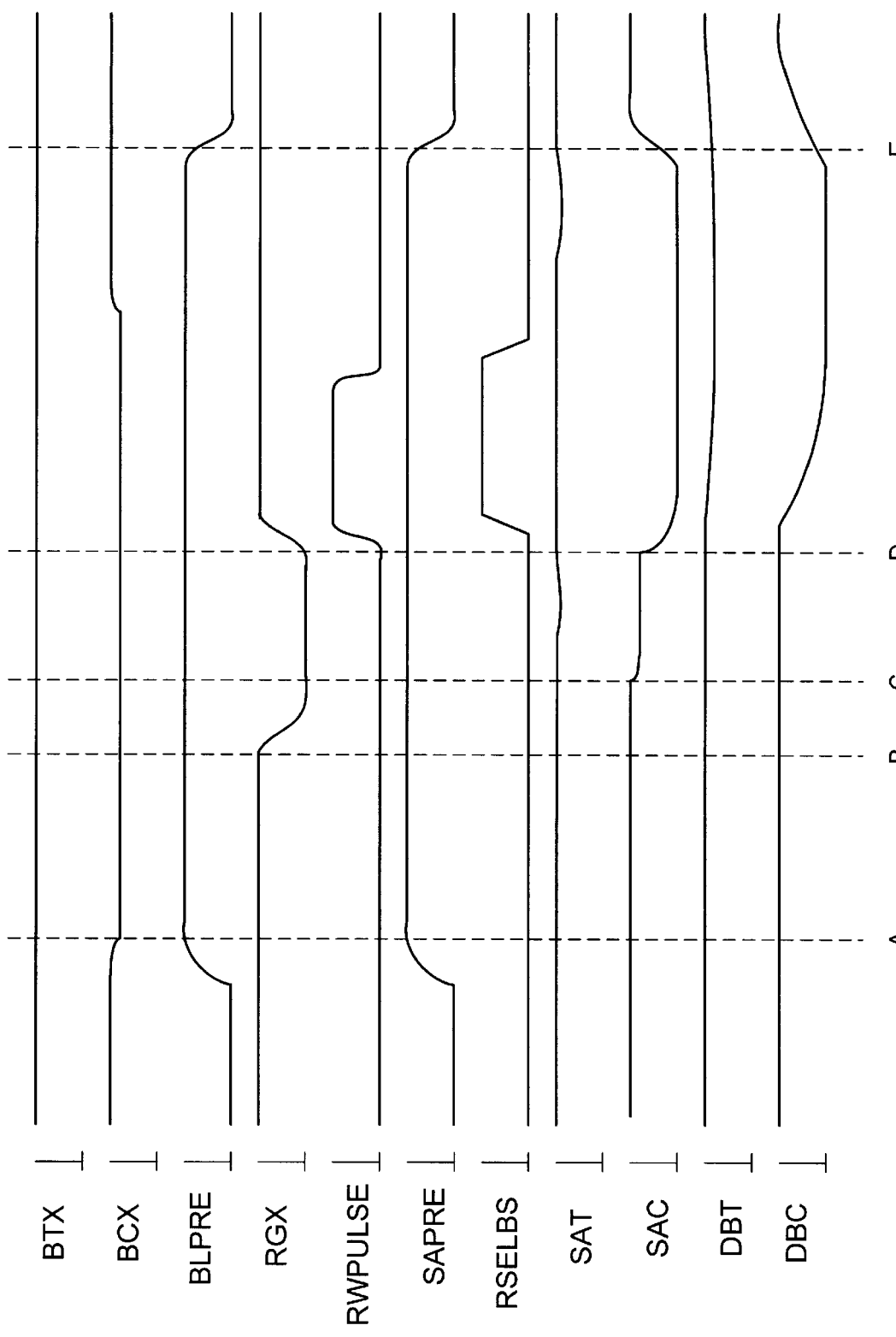
FIG. 5 is a timing diagram illustrating signal timing during a read operation in accordance with the preferred embodiment.

The read operation of sense amp 200 will now be discussed with reference to FIGS. 4 and 5 collectively, with FIG. 5 illustrating in more detail the preferred relative timing of the sense amp and related control signals during a read operation.

The SAPRE and BLPRE control signals are first disabled (high). Disabling BLPRE turns of the equalization transistors on the bit mux 202. This allows the bit lines connected the bit muxes to float as read signals appear from the memory cells. That data can then be selectively muxed to SAT/SAC by bit mux 202. Likewise, disabling SAPRE turns off the equalization circuit that comprises transistors T4, T5 and T6 on sense amp 200. When the equalization circuit is on, transistors T4, T5 and T6 hold both inputs SAT/SAC to VDD. This assures that the inputs to the sense amp start each read at an equal value. When the equalization circuit is turned off, the SAT/SAC inputs are allowed to float according to the received inputs from the memory cells. Thus, one of the two SAT/SAC inputs will be pulled down slightly by the memory cells, i.e., SAT will be pulled down slightly if the read value is a zero, and SAC will be pulled down slightly if the read value is a one.

In FIG. 5, the illustrated example shows BLPRE and SAPRE being disabled at time A. Disabling BLPRE allows the bit lines BTX, BCX and BTY, BCY to float as data is read from the memory cells. In FIG. 4, an example is shown where data appears at time B on BTX and BCX in the form of a differential drop of approximately 170 mV on BCX. The bit mux control signals are then activated, causing a selected bit line signal to be passed to the sense amp. In FIG. 5, the RGX signal is illustrated as going low at time C, indicating a read from the X bit line pair. Thus, the signal on bit lines BTX and BCX would be coupled to SAT and SAC. In FIG. 4, the result is the relative drop on the SAC that occurs at time D.

After a delay to allow the data signal to appear on SAT/SAC, the RWPULSE signal is enabled (high). This "sets" the sense amp 200 by turning on transistor TS, which then turns on the cross coupled latch comprising transistors T0, T1, T2, and T3. The latch the amplifies the signals on SAT/SAC. In particular, if SAT has been pulled down slightly, indicating a read value of zero, transistors T1 and T2 will be turned on before transistors T0 and T3. This causes the latch to set with the node connected to SAT pulled low to ground and the node connected to SAC pulled high to Vdd. Thus, the sensed differential signal of SAT being slightly lower than SAC is amplified. Likewise, if SAC has been pulled down slightly, indicating a read value of zero, transistors T0 and T3 will be turned on before transistors T1 and T2. This causes the latch to set with the node connected to SAC pulled low to ground, and the node connected to SAT pulled high to Vdd. Thus, the sensed differential signal of SAC being slightly lower than SAT is amplified.

In the example of FIG. 5, SAC has dropped approximately 120 mV relatively to SAT and thus upon amplification at time E, SAC is driven low by the sense amp while SAT is driven high.

The RSELBS signal is then enabled (high). This turns on the read driver, allowing amplified signals from SAT/SAC onto DBT/DBC. Specifically, when RSELBS goes high, transistors T13 and T14 turn on while transistors T15 and T16 turn off. This causes the signal on SAT to be propagated through transistors T17, T19 and T21 to DBT, and the signal on SAC to be propagated through transistors T18, T20 and T22 to DBC.

Thus, in the example of FIG. 5, the amplified signals on SAT and SAC are shown as propagating to D13T and DBC shortly after amplification.

To summarize, during a read operation, the bit mux 202 selects one of a plurality of bit line pairs to pass to the sense amp 200. Sense amp 200 then receives the passed differential signal on SAT/SAC, amplifies that differential signal, and drives the amplified differential signal to DBT/DBC.

Figure 6:
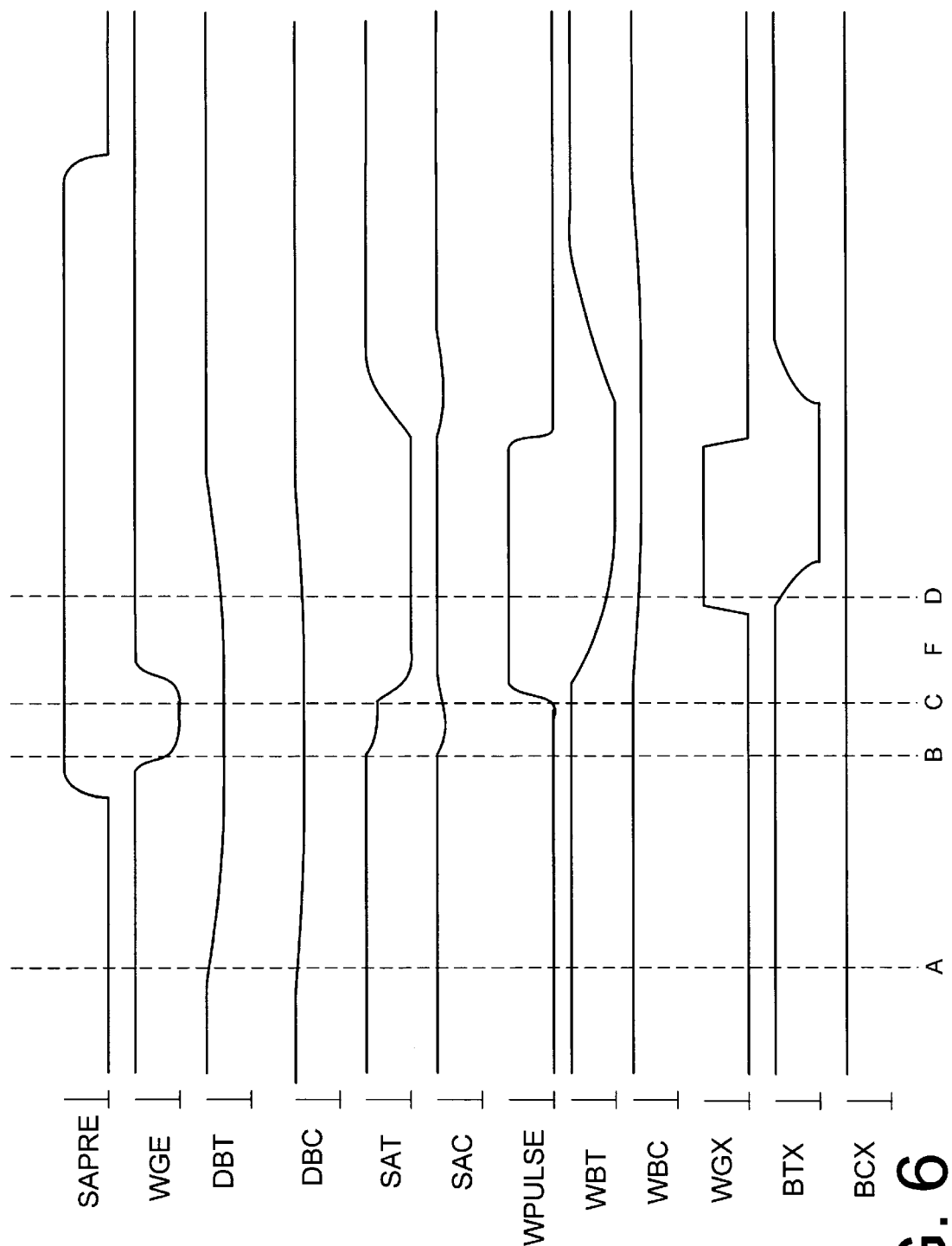
FIG. 6 is a timing diagram illustrating signal timing during a write operation in accordance with the preferred embodiment.

The write operation of sense amp 200 will now be discussed with reference to FIGS. 4 and 6 collectively, with FIG. 6 illustrating in more detail the preferred relative timing of the sense amp and related control signals during a write operation.

During a write operation data is first provided on DBT/DBC by the connected device. In the example of FIG. 6, the DBC signal is illustrating as starting to drop at time A. The SAPRE control signal is then disabled (high). This again turns of the equalization circuit that comprises transistors T4, T5, and T6, allowing the SAT/SAC nodes to float. The WGF signal is then enabled (goes low), turning on transistors T11 and T2 which cause the differential signal on DBT/DBC to be put onto SAT/SAC.

In the example of FIG. 6, the signal on DBT and DBC is shown as appearing on SAT and SAC at time B.

After a delay to allow the data signal to appear on SAT/SAC, the RWPULSE signal is enabled (high). Again, this "sets" the sense amp 200 by turning on transistor TS, which then turns on the cross coupled latch comprising transistors T0, T1, T2 and T3. The latch the amplifies the signals on SAT/SAC. In particular, if SAT has been pulled down slightly by DBT, indicating a write value of zero, transistors T1 and T2 will be turned on before transistors T0 and T3. This causes the latch to set with the node connected to SAT pulled low to ground, and the node connected to SAC pulled high to Vdd. Thus, the sensed differential signal of SAT being slightly lower than SAC is amplified. Likewise, if SAC has been pulled down slightly by DBC, indicating a write value of zero, transistors T0 and T3 will be turned on before transistors T1 and T2. This causes the latch to set with the node connected to SAC pulled low to ground, and the node connected to SAT pulled high to Vdd. Thus, the sensed differential signal of SAC being slightly lower than SAT is amplified.

In the example of FIG. 6, SAT is relatively lower than SAC when RWPULSE is enabled, and thus at time C when the sense amp sets SAT is pulled low and SAC is pulled high.

The amplified data on SAT/SAC is then driven to the memory cells through write driver transistors T7, T8, T9 and T10 and onto WBT/WBC. Specifically, a high data signal on SAT and a low data signal on SAC turns on transistors T8 and T9 and turns off transistors T7 and T10, causing a low signal to be driven on WBC and a high signal to be driven on WBT. Likewise, a low data signal on SAT and a high data signal on SAC turns off transistors T8 and T9 and turns on transistors T7 and T10, causing a high signal to be driven on WBC and a low signal to be driven on WBT.

In the example of FIG. 6, amplified signals on SAT and SAC are driven to the bit mux on WBT and WBC. The bit mux then passes the amplified signals to the selected bit line pair. In FIG. 6, WGX is enabled, indicating a write to the bit line pair X. Thus, the amplified signals appear on BTX and BCX starting at time D.

Figure 7:
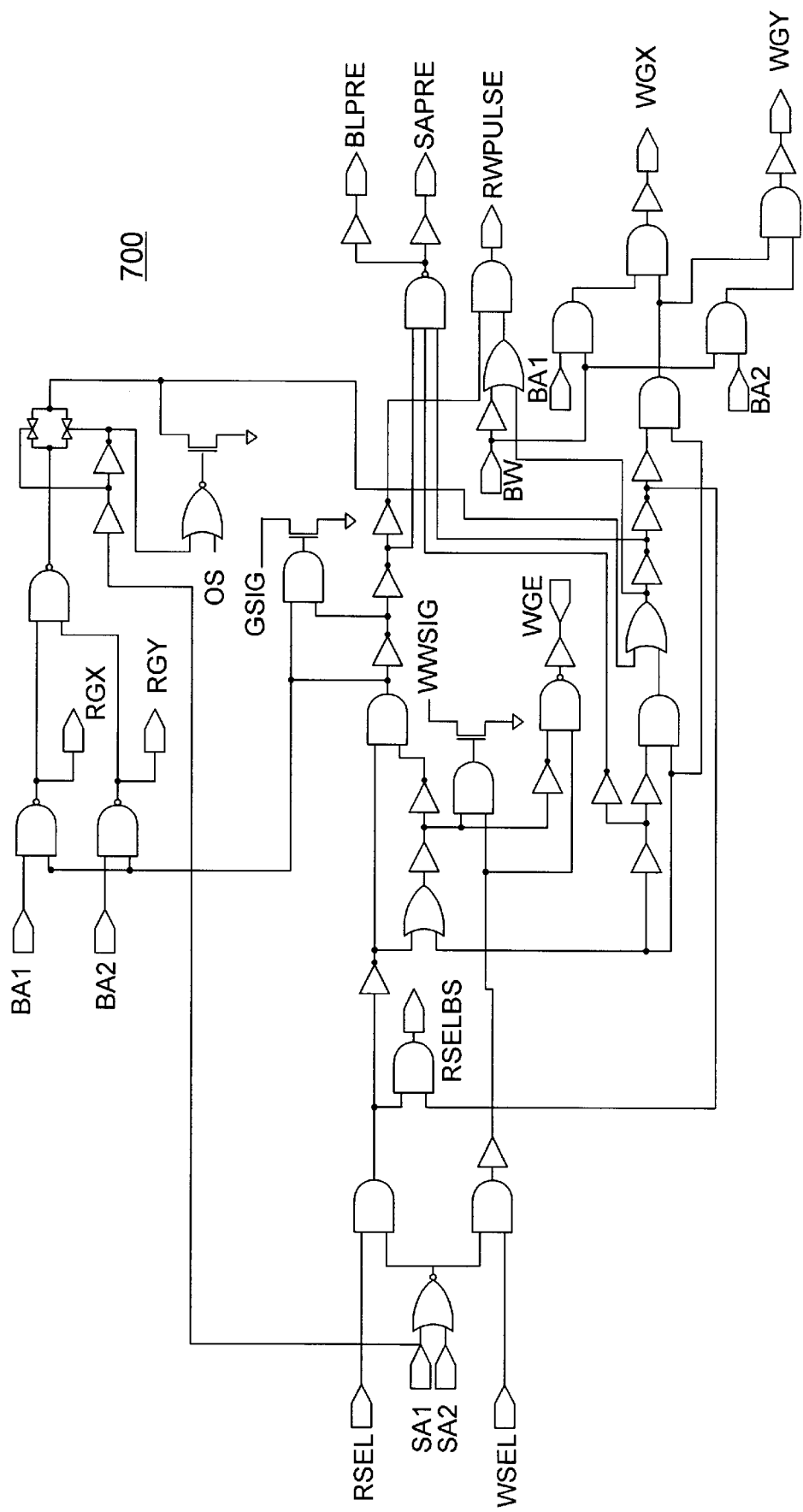
FIG. 7 is a circuit diagram of a gating logic circuit in accordance with the preferred embodiment of the present invention.

Turning now to FIG. 7, an schematic diagram illustrates exemplary gating logic 700 that can be used to implement the preferred embodiments. Typically, a gating logic 700 would be provided for each subarray in the memory system, providing self timing and allowing individual control over the individual subarrays. The gating logic receives various input signals, including read and write clocks signals (RSELBS) subarray addressing signals (SA1 and SA2), bit column addressing signals (BA1 and BA2). The RSEL clock signal is used to clock read operations, and the WSEL is used to clock write operations, with both signals preferably created from a single input clock and a read/write select. The subarray address signals are decoded addresses used to indicate whether the corresponding subarray or an opposing subarray is to be accessed. Likewise, the bit column addressing signals are decoded addresses used to select which bit column (e.g., X or Y) in the corresponding subarray are read from or written to the gating logic could also receive an OS signal from an opposing subarray.

The gating logic outputs various control signals, including RGX, RGY, WGX, WGY, BLPRE, SAPRE, RWPULSE, RSELBS and WGE. These signals are then used as described above to control the operation of the sense amp and the bit muxes as described above. For example, the gating logic provides the RWPULSE signal with the appropriate width depending for both read and write operations, as illustrated in FIGS. 5 and 6.

The gating logic also provides a GSIG signal that is sent to data bus control logic during read operations to activate secondary sense amps on the device side of the databus that amplify the output. The gating logic likewise provides a WWSIG to signal that is sent during writes to activate the corresponding local word line with a fixed width pulse.

Thus, the sense amp 200 provides bi-directional capability in a differential amplifier. This allows the same sense amp 200 to be used for both read and write operations, eliminating the need for two separate sense amps, and thus saving both device space and power consumption. Specifically, the transistors TS and T1–T6 are shared for both read and write operations. Furthermore, when combined with a bit mux for selective addressing, a single sense amp 200 can selectively provide amplification for multiple (2, 4, 8, etc.) bit columns of memory, further reducing device size. Furthermore, the use of the bi-directional differential sense amp facilitates the use of segmenting the memory into subarrays and selectively activating those subarrays to reduce power consumption.

The resulting preferred memory system is one that can be used in a wide variety of applications, and is particularly application to low power ASIC chips that are used in portable, battery powered applications.

Thus, the preferred embodiment of the present invention provides a device and method for reducing power consumption in memory system. In the preferred embodiment of the present invention, the sense amplifier comprises a bi-directional sense amp that is configurable for use on low power static random access memory (SRAM) devices. The bi-directional sense amp allows the same sense amp to be used for both read and write operations on the memory cells. The bi-directional nature of the sense amp reduces the device size and complexity, reducing power consumption while providing high performance access to the SRAM cells.

While the invention has been particularly shown and described with reference to a preferred exemplary embodiment thereof, it will be understood by those skilled in the art that various changes in form and details may be made therein without departing from the spirit and scope of the invention. It will be also understood that while various of the conductors are shown in the drawing as single lines, they are not so shown in a limiting sense, and may comprise plural conductors, as is understood in the art.

What is claimed is:

1. A sense amp comprising:
   a differential input;

a latch, the latch sensing a differential memory signal on the differential input and amplifying the differential memory signal for both read and write operations;

a write driver for driving the amplified differential memory signal to the memory during a write operation; and a read driver for driving the amplified differential memory signal to the differential data bus during a read operation.

2. The sense amp of claim 1 further comprising an equalization circuit coupled to the differential input, the equalization circuit holding the differential input equal before read and write operations.

3. The sense amp of claim 1 wherein the latch comprises a cross-coupled latch, and a control input, wherein the cross-coupled latch is selectively turned on with the control input.

4. The sense amp of claim 2 wherein the equalization circuit comprises a first and second transistor, the first and second transistor pulling the differential input to Vdd when the equalization circuit is activated, the equalization circuit further including a third transistor, the third transistor coupling the differential input together when the equalization circuit is activated.

5. The sense amp of claim further comprising a write enable input, wherein the write enable input couples the differential input to the differential data bus when activated such that memory data from the differential data bus appears on the differential input.

6. The sense amp of claim 1 wherein the sense amp is facilitates reads from and writes to static random access memory.

7. The sense amp of claim 1 wherein the sense amp is coupled to a bit mux, the bit mux selectively coupling the differential input to one of the plurality of bit columns.

8. An apparatus comprising
a sense amp, the sense amp comprising:
a differential input, the differential input having a true side and a complement side, the differential input coupled to a memory and coupled to a differential data bus;

a latch having a first input coupled to the true side and a second input coupled to the complement side, the latch further including a control input for selectively enabling the latch, such that when the control input is enabled the latch senses a differential signal on the differential input and latches to amplify the differential signal during both read and write operations;

an equalization circuit, the equalization circuit coupled to the differential input and holding the differential input equal when activated;

a write driver for driving the amplified differential signal to the memory during a write operation;

a read driver for driving the amplified differential signal to the differential data bus during a read operation.

9. The apparatus of claim 8 the latch comprises a cross coupled latch.

10. The apparatus of claim 8 further comprising a bit mux, wherein the bit mux is coupled to a plurality of differential bit columns, wherein the bit mux is coupled to the sense amp differential input to provide the differential signal to the sense amp, and the bit mux is coupled to the write driver for receiving the amplified differential signal from the sense amp, and wherein the bit mux facilitates selectively reading from and writing to a selected one of the plurality of differential bit columns.

11. The apparatus of claim 10 wherein bit mux includes a plurality of equalization circuits, with each of the plurality of equalization circuits equalizing and holding high one of the differential bit columns when the plurality of equalization circuits are activated.

12. The apparatus of claim 8 wherein the write driver comprises a true side write driver and a complement side write driver, and wherein the true side write driver is coupled to the differential input complement side and wherein the complement side write driver is coupled to the differential input true side.

13. The apparatus of claim 8 wherein the memory comprises a static random access memory.

14. The apparatus of claim 13 the wherein the sense amp resides on a application specific integrated circuit.

* * * * *